United States Patent
May et al.

(10) Patent No.: US 6,875,693 B1
(45) Date of Patent: Apr. 5, 2005

(54) VIA AND METAL LINE INTERFACE CAPABLE OF REDUCING THE INCIDENCE OF ELECTRO-MIGRATION INDUCED VOIDS

(75) Inventors: Charles E. May, Gresham, OR (US); Wilbur G. Catabay, Saratoga, CA (US)

(73) Assignee: LSI Logic Corporation, Milpitas, CA (US)

( * ) Notice: Subject to any disclaimer, the term of this patent is extended or adjusted under 35 U.S.C. 154(b) by 18 days.

(21) Appl. No.: 10/400,297

(22) Filed: Mar. 26, 2003

(51) Int. Cl.[7] .............................................. H01L 21/44
(52) U.S. Cl. ...................................... 438/687; 438/637
(58) Field of Search ................................. 438/687, 638, 438/639, 643, 653, 689

(56) References Cited

U.S. PATENT DOCUMENTS 6,037,258 A    3/2000  Liu et al. .................... 438/687
6,689,684 B1 * 2/2004  You et al. .................... 438/639
6,706,629 B1 * 3/2004  Lin et al. ..................... 438/687

\* cited by examiner

*Primary Examiner*—Roy Potter
(74) *Attorney, Agent, or Firm*—Beyer Weaver & Thomas, LLP

(57) ABSTRACT

Embodiments of the invention include a method for forming copper interconnect structure. The method involves providing a substrate having a copper conductive layer formed thereon. An insulating layer having openings is formed on the conductive layer so that the openings expose portions of the underlying conductive layer at the bottom of the openings. A barrier layer is formed on the surface of the substrate. A portion of the barrier layer is removed at the bottom of the opening to expose the underlying conductive layer. A copper plug is formed in the opening such that the bottom of the plug is in contact with the exposed conductive layer. The substrate can be subjected to further processing if desired. The invention also includes a copper interconnect structure having increased resistance to electromigration.

17 Claims, 5 Drawing Sheets

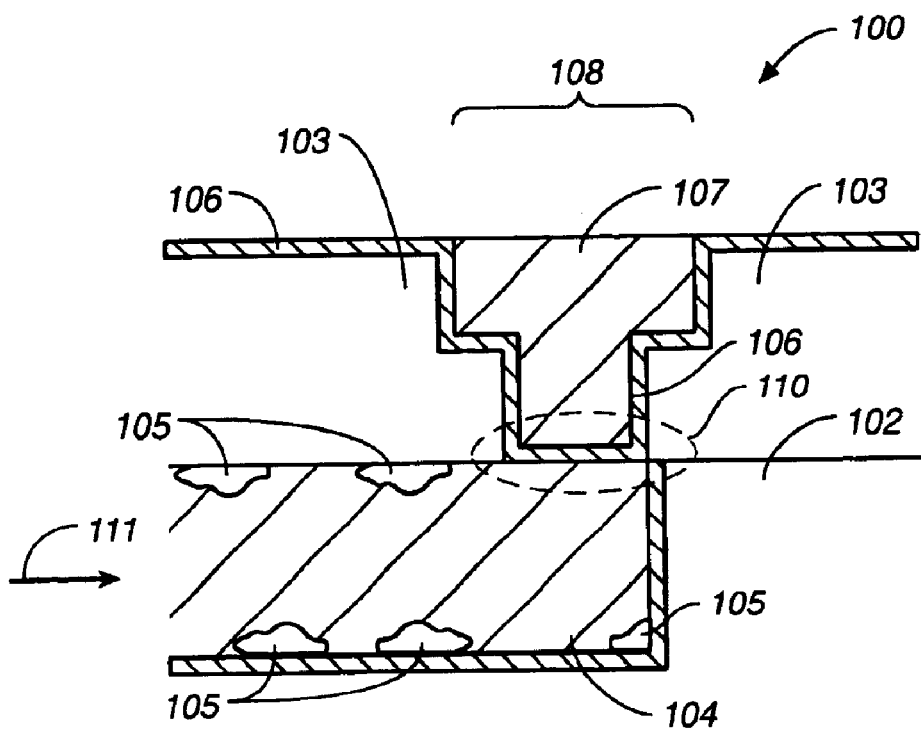
FIG._1a
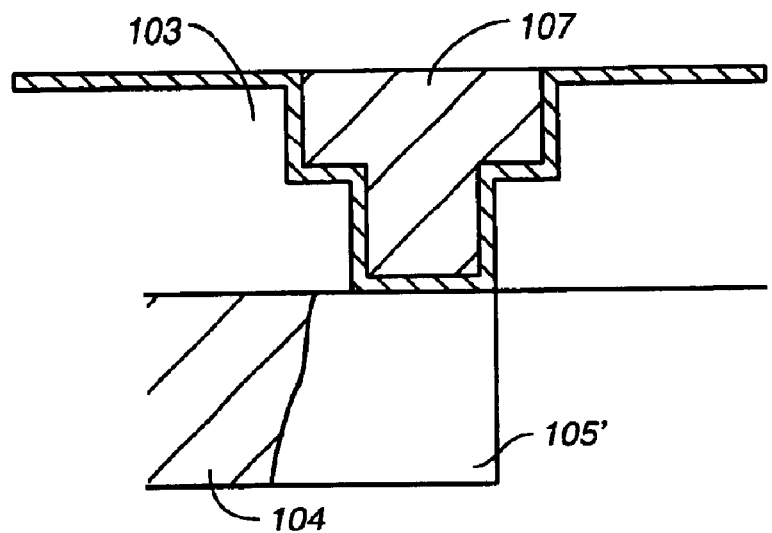
FIG._1b

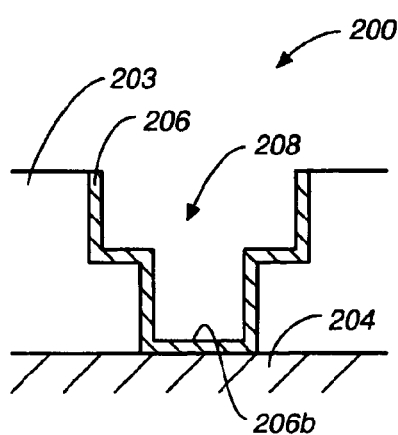
FIG._2a
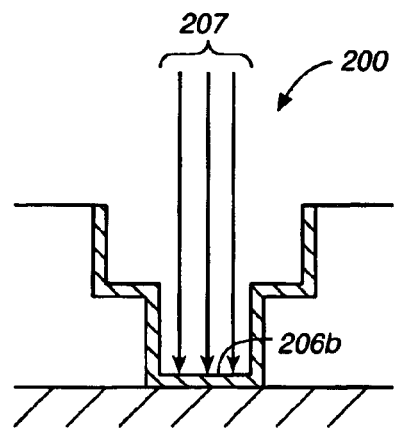
FIG._2b
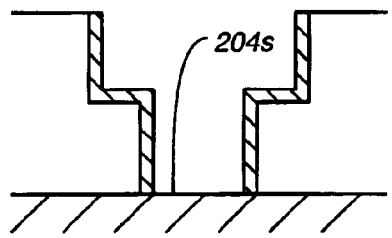
FIG._2c
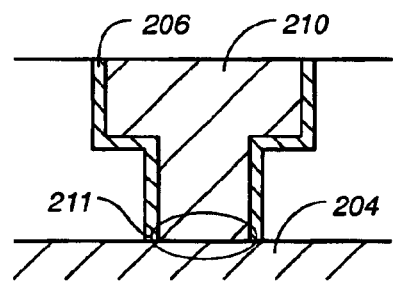
FIG._2d

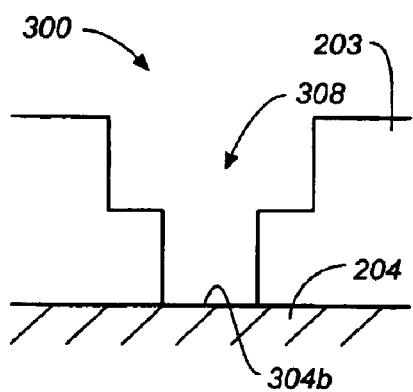
FIG._3a
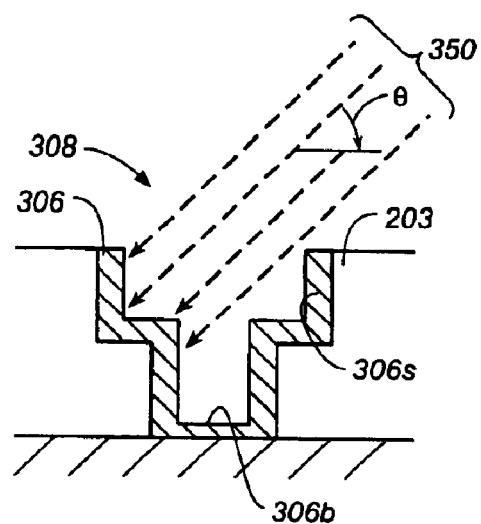
FIG._3b
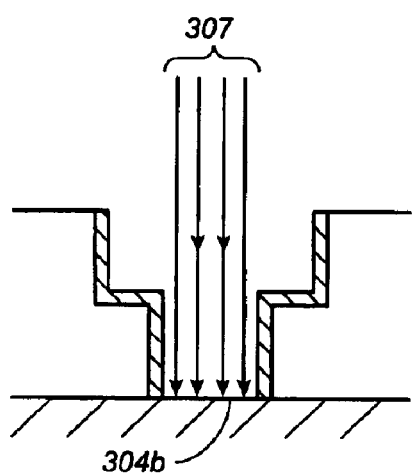
FIG._3c
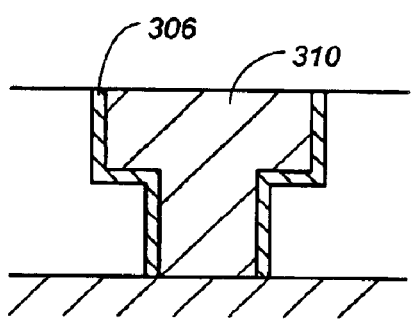
FIG._3d

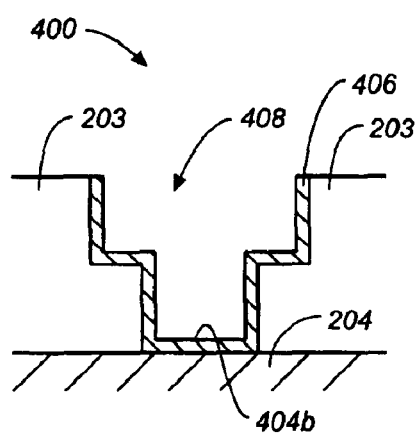
FIG._4a
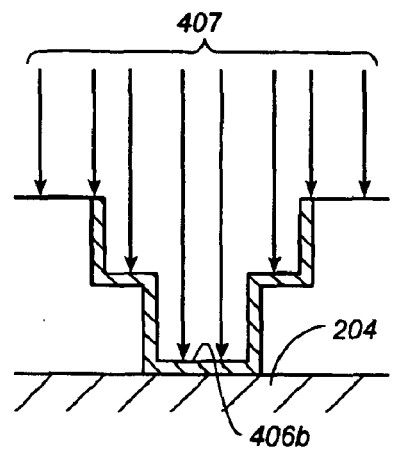
FIG._4b
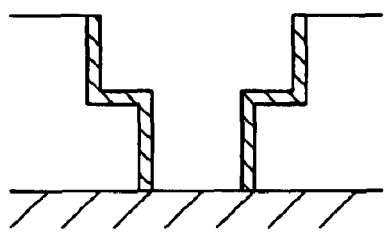
FIG._4c
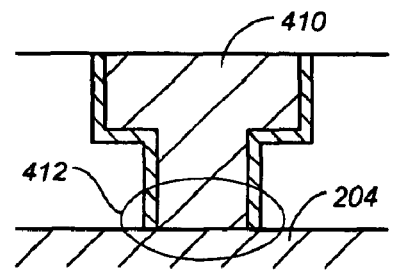
FIG._4d

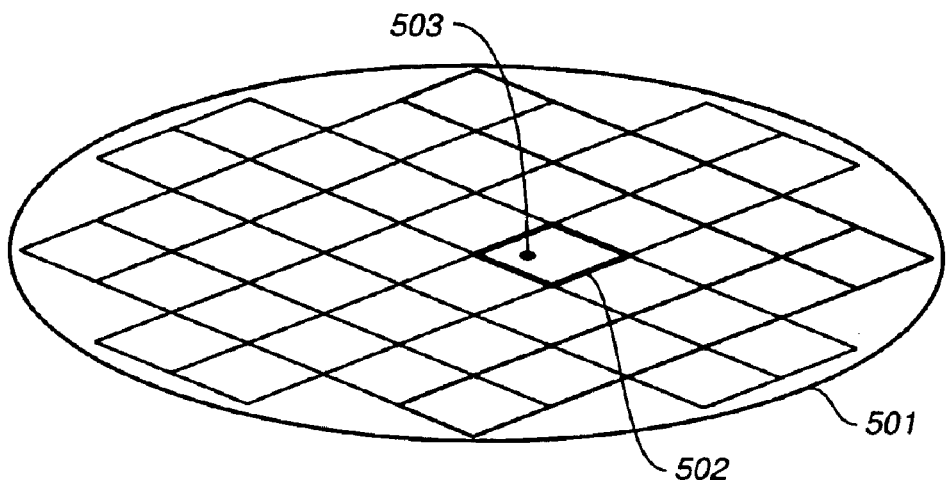
FIG._5
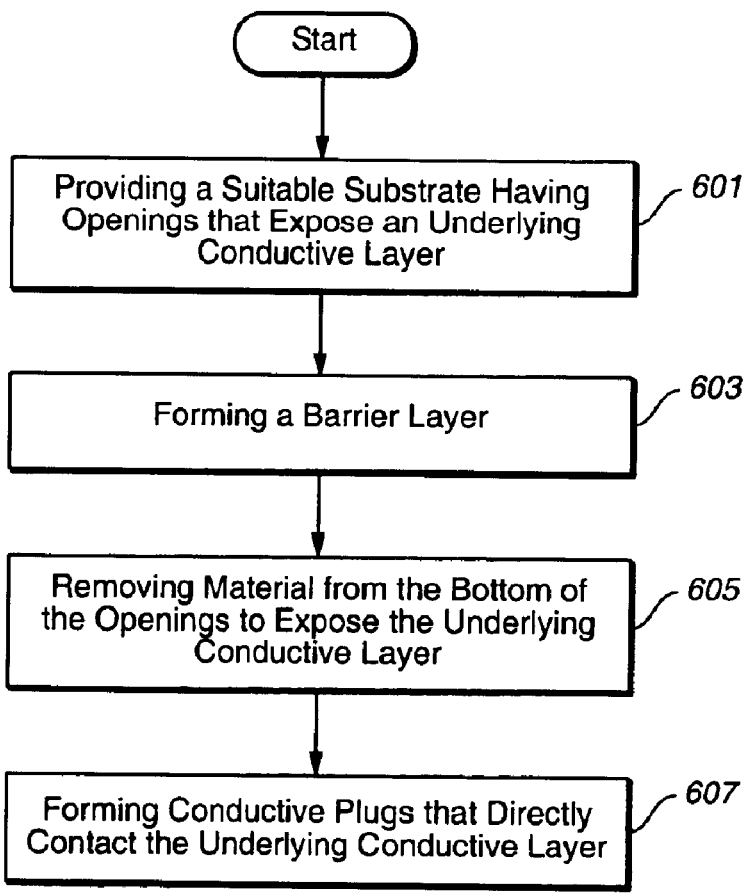
FIG._6

VIA AND METAL LINE INTERFACE CAPABLE OF REDUCING THE INCIDENCE OF ELECTRO-MIGRATION INDUCED VOIDS

TECHNICAL FIELD

The invention described herein relates generally to semiconductor devices and processing. In particular, the invention relates to semiconductor devices and processes that incorporating improved via and copper interconnect structures. And most particularly, the invention relates forming an improved interface between a copper interconnect and an associated copper-filled via structure.

BACKGROUND

The semiconductor industry makes wide use of copper conductive lines and interconnect structures in the construction of semiconductor devices. Copper has proven to be a very useful material for a number of reasons. For example, copper has a lower resistivity than aluminum. As a result, copper circuitry suffers less from resistance-capacitance (RC) delays. This makes copper systems faster.

However, copper has the disadvantage of high diffusivity through dielectric and silicon materials on which the copper is deposited. This is especially problematic when used with so-called low-K dielectric materials, which are coming into increasingly common usage. Diffusion of copper into insulating layers comprised of low-K dielectric materials can result in serious problems. Diffusion of copper into low-K materials typically "poisons" the materials so that semiconductor device failure is common. The industry has adapted to this problem by implementing barrier layers to prevent the diffusion of copper into the affected materials. Typically, the barrier materials consist of thin layers of material interposed between copper layers and low-K dielectric layers.

Although such barrier layers are effective at preventing the diffusion of copper materials, such barrier layers come with their own set of process difficulties. One such problem is that barrier layers can contribute to electromigration induced voiding in copper interconnect structures. Such voiding is a common source of circuit failure in copper based semiconductor structures. Such voiding is particularly problematic when it occurs in via structures. Research has shown that electromagnetic voiding is particularly common at the interface between the copper layer and the barrier layer.

This problem can be illustrated with reference to the schematic cross-section views illustrated in FIG. 1(a) and FIG. 1(b). In FIG. 1(a), a conventional semiconductor substrate 100 is depicted. A wafer surface 102 is depicted with a metal interconnect line 104 formed therein. Such wafers 102 are commonly formed of silicon or doped silicon. The metal interconnect line 104 is typically formed using copper or copper-containing materials (e.g., copper alloys or copper laminates and the like). An insulating layer 105 comprised of electrically insulating material (e.g., $SiO_2$, low-K dielectrics, and other like materials) is formed over the wafer surface 102. In order to make electrical connections to overlying layers (not shown) openings 108 are formed in the insulating layer 105 to expose the underlying metal interconnect line 104. Such openings 108 are commonly formed using damascene or dual-damascene fabrication processes. A barrier layer 106 is commonly formed on the wafer surface 102 covering the insulating layer 105 and also covering the bottom and sidewalls of the opening 108. Subsequently, a plug 107 is formed in the opening 108 to form a via structure. The plug 107 is formed of a copper or copper-containing material constructed using ordinary fabrication techniques known to persons having ordinary skill in the art. The barrier layer 106 prevents diffusion of the copper from the plug 107 into the insulating layer 103.

An additional feature of such structures are the presence of minute voids 105 in the interconnect line 104. During the ordinary operation of integrated circuit structures containing such copper interconnects, copper atoms migrates within the interconnect lines 104. Additionally, it has been determined that one of the major pathways for such copper migration is the interface 110 between the interconnect line 104 and the barrier layer 106. Under certain common operating conditions this copper migration causes the voids 105 to move. In the depicted embodiment, the voids 105 move in a direction indicated by the arrow 111. Over time the migrating voids 105 tend to aggregate.

As depicted in FIG. 1(b) the aggregate voids 105' can become quite sizable. In fact the aggregate voids 105' can be come so large that they occlude the conduction pathways in the interconnect lines 104. Also, the aggregate voids 105' can occlude the connections between certain vias and the interconnect lines. FIG. 1(b) depicts this problem. The aggregate void 105' has migrated to the interface between the plug 107 and the interconnect line 104. Also, the aggregate void 105' has grown so large that it destroys the current path between the plug 107 and the interconnect line 104. Current solutions to this problem require that a secondary via be constructed so that when one via fails a conduction path can still be achieved through the secondary via. Although such solutions work well enough for their intended purpose, improved solutions are desirable.

SUMMARY OF THE INVENTION

In accordance with the principles of the present invention, an improved interconnection structure and method for its fabrication are disclosed.

In general, the present invention is directed toward methods and structures that formed interconnect structures having increased electromigration lifetimes and a lower incidence of void induced circuit failures. In one implementation of the invention, vias are formed so that there is no barrier layer formed at the interface between the bottom of a copper plug and the underlying copper line. As desired, such structures can exhibit increased electromigration lifetimes and a lower incidence of void induced circuit failures.

One embodiment of the invention includes a method for forming a copper interconnect structure. The method involves providing a substrate configured in readiness for conductive via formation. The substrate includes a conductive layer formed of copper-containing material with an insulating layer formed thereon. The insulating layer has an opening that exposes a portion of the underlying conductive layer. A barrier layer is formed on the insulating layer and on the surfaces of the opening as well as on the exposed portion of the conductive layer. The portion of the barrier layer at the bottom of the opening is removed to expose a portion of the underlying conductive layer. A conductive plug is formed with a copper-containing material in the opening such that the bottom of the plug is in contact with the exposed conductive layer. Thus, the interface between the plug and the underlying conductive layer is formed without a barrier layer at the interface.

In a related embodiment, the barrier layer is formed as a non-uniform barrier layer having a greater thickness on the insulating layer and on the sidewalls of the opening, whereas the portion of the barrier layer formed on the bottom of the opening is formed having a relatively thinner dimension.

Another embodiment comprises a copper interconnect structure. The structure comprises a semiconductor substrate having a conductive layer formed thereon. The conductive layer being formed of copper-containing materials. An insulating layer is formed on the conductive layer and includes openings that expose portions of the underlying conductive layer at the bottom of the openings. The openings include a layer(s) of barrier material formed on the sidewalls of the openings. The barrier layer(s) is formed of materials that are resistant to copper diffusion to prevent copper from diffusing into the insulating layer. Conductive plugs comprised of copper-containing material are formed in the openings such that the bottom of the plugs are in contact with the underlying exposed portions of the conductive layer.

Other aspects and advantages of the invention will become apparent from the following detailed description and accompanying drawings which illustrate, by way of example, the principles of the invention.

BRIEF DESCRIPTION OF THE DRAWINGS

The following detailed description will be more readily understood in conjunction with the accompanying drawings, in which:

FIGS. 1(a) and 1(b) are simplified schematic cross-section views of a conventional copper interconnect structure illustrating the problem of voiding in conventional circuit structures.

FIGS. 2(a)–2(d) are simplified cross-sectional views of a semiconductor substrate used to illustrate aspects of a method embodiment used to construct an interconnect structure in accordance with the principles of the invention.

FIGS. 3(a)–3(d) are simplified cross-sectional views of a semiconductor substrate having an interconnect embodiment formed thereon in accordance with the principles of the invention.

FIGS. 4(a)–4(d) are simplified cross-sectional views of a semiconductor substrate illustrating yet another embodiment of an interconnect structure formed thereon in accordance with the principles of the invention.

FIG. 5 is a figurative depiction of a semiconductor wafer formed having interconnect structures of the type described herein comprising part of its circuitry in accordance with the principles of the invention.

FIG. 6 is a flow diagram that describes a method embodiment for implementing a process for constructing a copper interconnect in accordance with the principles of the present invention.

It is to be understood that in the drawings like reference numerals designate like structural elements. Also, it is understood that the depictions in the Figures are not necessarily to scale.

DETAILED DESCRIPTION OF THE DRAWINGS

The present invention has been particularly shown and described with respect to certain embodiments and specific features thereof. The embodiments set forth hereinbelow are to be taken as illustrative rather than limiting. It should be readily apparent to those of ordinary skill in the art that various changes and modifications in form and detail may be made without departing from the spirit and scope of the invention.

In the following detailed description, various method embodiments for forming conducting structures in layers of insulating materials will be disclosed. In particular, the depicted structures show the formation of copper conducting structures that are suitable for interconnecting copper lines of one layer in a multi-layer semiconductor device to other underlying copper lines. The inventors specifically contemplate that the principles of the invention are not strictly confined to copper materials but that they can also be applied to copper-containing materials as well. Moreover, the inventors contemplate that the principles of the invention are not limited to just interconnect and via structures, but that they can also be applied to any interconnections between conducting structures in a semiconductor substrate.

During ordinary course of operation, the via 107 of FIGS. 1(a) and 1(b) has a high density of copper (Cu) ion flux. The presence of the barrier layer 106 in region 110 contributes significantly to the formation of voids at the metal/via interconnect. An aspect of the present invention is directed to reducing the incidence of voiding and circuit failure at the interface between the via and the underlying conducting layer by removing the barrier layer at the interface.

FIGS. 2(a)–2(d) illustrate one method embodiment used for constructing an improved via/interconnect structure. FIG. 2(a) depicts a suitable substrate in readiness for the formation of such an improved via/interconnect structure. The substrate 200 typically comprises a semiconductor substrate having a conducting layer 204 formed thereon. Such conducting layers 204 are typically, formed of copper-containing materials. One typical example is a conducting layer 204 that is comprised substantially of copper. However, the inventors point out that such copper containing conducting layers 204 can include, without limitation, copper alloy materials, multilayer structures containing copper, as well as other like materials.

An insulating layer 203 is formed on the substrate surface. The insulating layer 203 is formed over the conducting layer 204. The insulating layer 203 is commonly referred to as an inter-layer dielectric (ILD). Although in many implementations, a barrier material is formed over the conducting layer 204 such that the ILD 203 lies over the barrier material. The barrier material is intended to prevent copper diffusing from the conducting layer 204 into the ILD 203. For illustration purposes these drawings do not include the aforementioned barrier material.

In continuation, for many embodiments the ILD 203 is formed of low-K dielectric materials or other electrically isolating materials. The principles of the present invention find particular utility when applied to use with low-K dielectric materials. Examples of such materials include spin-on and CVD polymeric materials based on silicon or carbon, or based on combinations of silicon and carbon. Particular low-K materials include, but are not limited to: organic thermoplastic and thermosetting polymers such as polyimides, polyarylethers, benzocyclobutenes, polyphenylquinoxalines, polyquinolines; inorganic and spin-on glass materials such as silsesquioxanes, silicates, and siloxanes; and, mixtures, or blends, of organic polymers and spin-on glasses. Further, examples of CVD low-K materials include SiCOH or polymers of parylene and napthalene, copolymers of parylene with polysiloxanes or teflon, and polymers of polysiloxane. Other ILD 203 materials include, but are not limited to, silicon dioxide or combinations of silicon dioxide and other doped dielectrics (e.g., BPSG, PSG).

Openings 208 are formed in the ILD 203 to expose the underlying conducting layers. Such openings 208 are typically formed using methodologies well known to those having ordinary skill in the art. Suitable techniques include, but are not limited to, damascene and dual damascene fabrication processes. So far, the structure 200 is formed in accordance with well-known convention semiconductor fabrication processes. The openings expose a portion of the underlying conducting layer 204.

In many applications, the substrate is now pre-cleaned to remove native oxides. In particular, such pre-cleaning is employed to remove a thin layer of copper oxide from the exposed portion of the underlying conducting layer 204 at the bottom of the opening. A typical approach for pre-cleaning involves sputtering the surface with a plasma formed using argon, hydrogen, or carbon fluoride ($CF_x$) materials. Such sputtering should be conducted until about 50 Å of oxide are removed. Techniques for achieving such pre-cleaning are known to persons having ordinary skill in the art. At this point a copper diffusion barrier layer 206 can be formed.

Such a barrier layer 206 is formed on the substrate. In particular, the barrier layer 206 is formed so that it coats the sidewalls and bottom of the opening 208. In the depicted embodiment, the barrier layer 206 covers the underlying conducting layer 204 to form a bottom barrier layer 206b. The disadvantages of this bottom barrier layer 206b have already been discussed. The barrier layer 206 is formed to prevent the diffusion of copper into the ILD 203. Typical barrier materials include tantalum (Ta) or titanium (Ti) based barrier materials (e.g., tantalum nitrides (TaN), tantalum silicon nitrides (TaSiN), or titanium nitrides (TiN)). Additionally, multi-layer barrier layers can be formed. Also, graded layer barrier layers 206 can be used. Such layer can be augmented with other layers that incorporate materials like magnesium (Mg), palladium (Pd), chromium (Cr), and molybdenum (Mo), vanadium (V), tungsten (W), or other related materials. Alternatively, barrier layers 206 comprised of silicon carbide (SiC) and silicon carbon nitride (SiCN) or other like materials can be used. Such barrier layers 206 can be formed using conventional approaches. For example a TaN barrier layer 206 can be formed using physical vapor deposition (PVD) or chemical vapor deposition (CVD) techniques or even atomic layer deposition (ALD). Commonly, such layers are formed in the range of about 5 to 400 Å thick with a preferred thickness in the range of in the range of about 150–250 Å thick.

One of the difficulties in the present art is that such barrier layers 206 can not be formed without forming a thin barrier layer 206b on the bottom of the opening 208. It is this bottom barrier layer 206b that induces much of the voiding problem. Thus, an advantageous aspect of the invention concerns removing the bottom portion 206b of the barrier layer 206.

Typically, the bottom barrier layer 206b is removed by anisotropically (directionally) etching the substrate. Such anisotropic etching can be achieved in a number of ways known to those having ordinary skill in the art. For example, plasma etching, reactive ion etching (RIE), or ion milling can be used. One preferred etch chemistry used to remove the bottom barrier layer 206b includes etchants chosen from among the carbon fluoride family of etchants (e.g., $C_xH_yF_z$). For example, $CF_3H$ and $CF_4$ are suitable etchants. Additionally, sulfur fluoride ($SF_x$) etchants such as $SF_6$ are also satisfactory. Moreover, boron chloride etchants (e.g., $BCl_3$ as well as others) can be used in embodiments of the invention. Additionally, chlorine gases can be used as etchants in accordance with the principles of the invention. These etchants are flowed into a suitable process chamber and then ignited to form an etchant plasma. The substrate is exposed to the etchant plasma until the bottom barrier layer 206b is removed. It is specifically, pointed out that these disclosed etchants encompass a wide range of similar etchants known to persons having ordinary skill in the art that are suitable for removing the bottom barrier layer 206b.

Many different tools can be employed to accomplish the many operations of the disclosed process. FIG. 2(b) illustrates the application of an etchant plasma 207 being directed vertically onto the substrate 200. Particularly, the etchant plasma 207 is directed vertically onto the bottom barrier layer 206b. One example of a suitable tool is an Endura 5500 PVD tool manufactured by Applied Materials, Inc. of Santa Clara, Calif. In one implementation, the following process parameters can be used to anisotropically remove the bottom barrier layer 206b. Such a process operates in a plasma operating at relatively low pressure. Such plasma is generated at a power in the range of about 200–2000 W and a pressure of less than 75 mTorr, preferably less than about 20 mTorr and still more preferably, operating in the range of about 0.05 mTorr to about 7 mTorr. Moreover, a relatively high wafer bias, in the range of about 50 volts (V) to about 400 volts should be used to effectively remove the material of the bottom barrier layer 206b. One preferred implementation uses a power of about 200 W at about 7 mTorr with a wafer bias of about 50V. Under such conditions a TaN bottom barrier layer 206b of about 150 Å thick can be removed in about 30 s (seconds). The inventors point out that the aforementioned parameters and specific applications are given merely as an example that illustrates much wider principles of operation.

FIG. 2(c) the intended effect of the previously described anisotropic etching. Such anisotropic etching removes the bottom barrier layer 206b, exposing a portion of the underlying conducting layer 204. The exposed conducting surface 204s is now in readiness for copper interconnect formation.

Referring to FIG. 2(d) a copper-containing material is formed in the opening to create a conductive plug 210. The processes for forming such copper-containing plugs 210 are well known. For example, a thin seed layer of copper material can be formed on the barrier layer 206 in the opening 208. This is followed by the bulk deposition of a much thicker copper layer of copper material.

A suitable method for forming a copper seed layer is disclosed in U.S. Pat. No. 6,037,258 to Liu, et al. entitled "Method of Forming a Smooth Copper Seed Layer for a Copper Damascene Structure", which is hereby incorporated by reference. In one embodiment, the seed layer 202 can be formed by deposition using PVD techniques. One suitable process employs a PVD machine (e.g., the Endura 5500) at a power in the range of about 10–100 kW at a pressure of about 0.05 mTorr to about 5 mTorr. This seed layer is formed to a thickness of about 50–100 Å.

The bulk copper layer is formed over the copper seed layer. The bulk copper layer is typically formed using bulk deposition techniques like electroplating. One suitable embodiment for forming the bulk copper barrier layer uses electroplating. An example process employs an Applied Materials Electra ECP machine using a copper sulfate solution having a plating current of about 10 A/cm to 100 A/cm. The bulk copper layer 203 is plated until the opening 171 is filled.

Other copper deposition techniques can be used as well. The final structure should demonstrate good electrical contact between the plug 210 and the underlying conducting layer 204 at the interface 211 between the plug 210 and the underlying conducting layer 204. Moreover, there is no barrier layer at the interface 211 between the plug 210 and the underlying conducting layer 204. Typically, once the plug 210 is formed it is subjected to chemical mechanical planarization (CMP) to form the depicted structure.

The structure depicted in FIG. 2(d) can be subjected to further processing to create additional layers if desired. For example, another barrier layer (or capping layer) can be formed over the structure depicted in FIG. 2(d) and another ILD can be formed. Further vias and conducting lines can also be formed. It should be readily appreciated by those having ordinary skill in the art that other conductive structures including, but not limited to: interconnects, trenches, trenches overlying vias, contacts and the like, can be constructed using the principles of the present invention.

FIGS. 3(a)–3(d) depict a slightly different embodiment than that depicted in FIGS. 2(a)–2(d). FIG. 3(a) depicts a suitable substrate in readiness for the formation of an improved via/interconnect structure. The substrate 300 is similar to that depicted in FIG. 2(a). The substrate includes a conducting layer 204 formed thereon. Such conducting layers 204 are typically formed of copper-containing materials as described hereinabove with respect to FIGS. 2(a)–2(d). As above, an insulating layer 203 is formed on the substrate surface. The insulating layer 203 is formed over the conducting layer 204. As above, the insulating layer 203 can be formed of a wide range of electrically insulating materials including low-K dielectric materials. Also as above, openings 308 are formed in the insulating layer 203 using methodologies well known to those having ordinary skill in the art. The openings expose a portion 304b of the underlying conducting layer 204. Also as previously disclosed, in many applications, prior to the formation of a barrier layer the substrate can be pre-cleaned to remove native oxides. Such pre-cleaning is conducted as described above.

With reference to FIG. 3(b), a non-uniform layer of barrier layer 306 is formed on the surface of the substrate 300. In particular, the non-uniform barrier layer 306 is formed on the bottom surface of the opening 306b (i.e., on the exposed portion of the conducting layer 204) and on the sidewalls 306s of the opening. In particular, the non-uniform barrier layer 306 is formed having a greater thickness on top of the substrate (e.g., on the insulating layer 203, such layer not being shown here) than on the bottom surface of the opening 306b. Also, the layer thickness on the sidewalls 306s is greater than the thickness of the bottom surface of the opening 306b. Heretofore, conventional processes expended great effort to avoid this non-uniformity in barrier layers. However, the prior art has not contemplated the advantages obtainable using such a non-uniform barrier layer.

A non-uniform barrier layer 306 can be formed on the substrate using a number of methodologies known to those having ordinary skill in the art. A few suitable examples are now disclosed. The barrier layer 306 is formed so that the bottom 306b is thinner than the sidewalls 306s or the top surfaces (not shown here). Typical barrier materials include tantalum (Ta) or titanium (Ti) based barrier materials (e.g., tantalum nitrides (TaN), tantalum silicon nitrides (TaSiN), or titanium nitrides (TiN)). Additionally, multi-layer barrier layers can be formed. Also, graded layer barrier layers 306 can be used. Such layer can be augmented with other layers that incorporate materials like magnesium (Mg), palladium (Pd), chromium (Cr), and molybdenum (Mo), vanadium (V), tungsten (W), or other related materials Alternatively, barrier layers 206 comprised of silicon carbide (SiC) and silicon carbon nitride (SiCN) or other like materials can be used. Such barrier layers 206 can be formed using conventional approaches.

In one preferred embodiment, a tantalum based barrier layer 306 is formed using a unidirectional PVD process. A PVD tool such as an Endura manufactured by Applied Materials, Inc. of Santa Clara, Calif. can be used to obtain a suitable barrier layer 306. For example, a tantalum barrier layer 306 can be formed by placing a substrate in a process chamber and then flowing argon (Ar) into the chamber. The Ar is igniting into plasma and used to sputter tantalum off a tantalum target. The sputtered tantalum 350 is directed by a bias voltage onto the substrate. In order to enhance the non-uniform distribution of material onto the surfaces of the opening 308, the tantalum is directed onto the substrate at a deposition angle θ (which is other than perpendicular to the surface). Although, many different deposition angles are possible, preferred angles are in the range of about 10 degrees (°) to about 80°. Such deposition angles θ can be achieved by many different approaches known to persons having ordinary skill in the art. For example, the magnetic fields of the deposition chamber can be adjusted so that a desired deposition angle θ can be achieved. Thus, a unidirectional deposition of tantalum (or other selected barrier material) can be accomplished. To form a barrier layer 306 on all sides of the opening 308 the substrate can be rotated which the deposition angle θ remains constant. This causes a relatively even axial deposition of tantalum. However, the same process results in a non-uniform distribution of material occurring such that barrier material at the bottom of the opening (e.g., 306b) is relatively thinner than the barrier material formed on the sidewalls (e.g., 306s). This non-uniform distribution of barrier layer thickness is what is meant by a non-uniform barrier layer 306. For example, in one implementation, the thickness of the barrier layer 306 on the surface of the insulating layer 203 (not shown here) can be about 1500 Å thick and a corresponding sidewall 306s thickness can be in the range of about 400–800 Å thick and a corresponding bottom layer 306b thickness can be in the range of about 100–200 Å thick. Thus, the bottom can be made very thin while still forming an effective barrier layer on the sidewalls 306s. Such a configuration can be achieved using an Endura PVD tool operating a power range of about 1000–24,000 W (target power). As Ar is flowed onto the chamber it is ignited into a plasma which sputters a tantalum target. Such process occurs at a pressure of less than about 20 mTorr, preferably operating in the range of about 0.5 mTorr to about 5 mTorr. The substrate can be lightly biased, in the range of about 50 W to about 500 W to direct the tantalum onto the substrate. As explained, in some embodiments magnetic fields can be used to achieve a desired deposition angle for the tantalum. Additionally, $N_2$ can be flowed into the chamber to form a barrier layer that comprises tantalum nitride material. Many other materials can be used and uni-directionally deposited to achieve a non-uniform barrier layer 306 being thinner of the sides and the top than on the bottom. One preferred implementation deposits a tantalum barrier layer 306 using a power of about 24,000 W at about 1.6 mTorr with a bias of about 300 W. Under such conditions a 150 Å thick TaN bottom barrier layer 306b can be formed in about 120 s (seconds). The inventors point out that the aforementioned parameters and specific applications are given merely as an example that illustrates much wider principles of operation.

Referring to FIG. 3(c), the bottom portion of the non-uniform barrier layer 306 is removed to expose the underlying metal layer 304b. As previously disclosed, the preferred approach for removing the bottom barrier layer 306b is by anisotropically (directionally) etching the substrate. As explained above, anisotropic etching can be achieved in a number of ways known to those of ordinary skill in the art. For example, plasma etching, reactive ion etching (RIE), or ion milling can be used. The same etchants and process operations as disclosed hereinabove can be used.

The substrate is exposed to a directional flow of etchants 307 until the bottom barrier layer 306b is removed. As before, the intended effect of the anisotropic etching is to remove the bottom barrier layer 306b, exposing a portion 304b of the underlying conducting layer 204. This exposed conducting surface 304b is now in readiness for copper interconnect formation.

Referring to FIG. 3(d) a copper-containing material is formed in the opening to create a conductive plug 310. As explained above, the processes for forming such copper-containing plugs 310 are well known. For example, a thin seed layer of copper material can be formed inside the opening and then the seed layer is treated to achieve the bulk deposition off copper materials to form the plug 310 in the opening.

FIGS. 4(a)–4(d) illustrate another approach for anisotropically etching away of a bottom portion of a barrier layer and the subsequent formation of an improved copper interconnect. Referring to FIG. 4(a), a substrate is formed similar to those previously described (e.g., as in FIGS. 2(a) or 3(b)). The substrate 400 includes a conducting layer 204 formed thereon. As before, the conducting layers 204 are typically formed of copper-containing materials as described hereinabove. Also as above, an insulating layer 203 is formed on the substrate surface. Also as above, openings 408 are formed in the insulating layer 203 using methodologies well known to those having ordinary skill in the art. The openings expose a portion 404b of the underlying conducting layer 204. Also as previously disclosed, a barrier layer 406 is formed on the substrate. Processes for forming such layers are as described as in FIGS. 2(a)–2(d) or FIGS. 3(a)–3(d) can be used. Also, as is known to persons having ordinary skill in the art, many other methods of forming such barrier layers can be used. A non-uniform barrier layer 406 is preferred (but not required) due to the ability to form very thin bottom barrier layers.

Referring to FIG. 4(b), the barrier layer 406 of the substrate 400 is then exposed to a flood ion beam 407 to anisotropically remove the bottom layer 406b of the barrier layer. Such a flood ion beam can be used to sputter material off the bottom of the openings. Such a methodology can be achieved using, for example, a High Density Plasma Flood System such as manufactured by Applied Materials, Inc. of Santa Clara, Calif. For example, such a system can use an energized argon (Ar) gas to produce an Ar plasma which is directed onto the substrate. Using ion densities in the range of about $1 \times 10^{16}$ to about $2 \times 10^{20}$ ions per $m^2$ suitable barrier layer removal can be achieved at the bottom of the opening to expose the underlying conducting layer 204. Suitable plasma energies are in the range of about 5 eV to about 50 eV for Ar plasma, and about 2 eV to about 50 eV for electrons.

Such a process can be used to produce a substrate similar to that depicted in FIG. 4(c). Such substrate can be cleaned to remove oxides and then treated to form an interconnect structure. As explained above, the processes for forming such interconnect structures are well known. For example, a thin seed layer of copper material can be formed inside the opening and then the seed layer is treated to achieve the bulk deposition off copper materials to form the interconnect in the opening. This structure can be used to form vias as well as many other structures. Reference to FIG. 4(d) shows a copper plug 410 filling the opening to comprise an interconnect via. No barrier material is present at the interface 412 between the interconnect plug 410 and the underlying conducting layer 204. Such a structure has a superior electromigration lifetime and improved resistance to void induced circuit failure.

Referring to FIG. 5, a semiconductor wafer is depicted. Typically, such wafers 501 having a multiplicity of integrated circuits (chips) 502 formed thereon. Each chip has many different types of circuit structures formed thereon. Accordingly, each chip 502 can include structures as depicted FIGS. 2, 3, and 4 (schematically depicted here as interconnect 503) as part of its structure.

FIG. 6 shows a flow diagram that depicts one embodiment of the above-described process. The method embodiment of FIG. 6 can be used to construct copper interconnects that are resistant to void induced failure and have longer electromigration lifetimes than conventional interconnects. The method involves providing a substrate having suitable substrate (Step 601). Such a substrate includes a conductive layer comprising a copper-containing material and having an insulating layer formed thereon. The insulating layer has openings that expose portions of the underlying conductive layer at the bottom of the openings. A barrier layer is then formed on the substrate (Step 603). Such barrier layers cover the insulating layer and the exposed portion of the conductive layer. Methods of forming such barrier layers are well described herein. Such layers include, but are not limited to, the non-uniform barrier layers described herein. The barrier layer at the bottom of the openings is then removed to expose the underlying conductive layer (Step 605). Such barrier layer removal is typically accomplished using anisotropic material removal processes (e.g., etch techniques) but is not limited to such. Conductive plugs are formed in the opening such that the bottom of the plug is in contact with the exposed conductive layer (Step 607). The present invention further covers semiconductor devices formed by the above method.

The present invention has been particularly shown and described with respect to certain preferred embodiments and specific features thereof. However, it should be noted that the above-described embodiments are intended to describe the principles of the invention, not limit its scope. Therefore, as is readily apparent to those of ordinary skill in the art, various changes and modifications in form and detail may be made without departing from the spirit and scope of the invention as set forth in the appended claims. Other embodiments and variations to the depicted embodiments will be apparent to those skilled in the art and may be made without departing from the spirit and scope of the invention as defined in the following claims. In particular, it is contemplated by the inventors that barrier layers in accordance with the principles of the present invention can be practiced with a number of different materials and formed by a wide variety of methods. Further, reference in the claims to an element in the singular is not intended to mean "one and only one" unless explicitly stated, but rather, "one or more". Furthermore, the embodiments illustratively disclosed herein can be practiced without any element which is not specifically disclosed herein.

We claim:

1. A method for forming a robust copper interconnect structure having increased resistance to void failure, the method comprising:

a) providing a substrate having a conductive layer formed thereon, the conductive layer comprising a copper-containing material and having an insulating layer formed thereon, the insulating layer having an opening that exposes a portion of the underlying conductive layer at the bottom of the opening;

b) forming a barrier layer on the substrate so that the barrier layer is formed on the insulating layer and on the exposed portion of the conductive layer in the opening;

c) removing a portion of the barrier layer at the bottom of the opening to expose the underlying conductive layer by anisotropically etching the barrier layer to expose the conductive layer at the bottom of the opening; and d) forming a conductive plug with a copper-containing material in the opening such that the bottom of the plug is in contact with the exposed conductive layer.

2. The method as in claim 1 wherein the operation of a) providing a substrate includes providing a substrate having a second barrier layer formed between the conductive layer and the insulating layer; and wherein anisotropically etching includes anisotropically etching the barrier layer and the second barrier layer at the bottom of the opening to expose the conductive layer.

3. The method as in claim 1 wherein the operation of anisotropically etching the metal barrier layer at the bottom of the opening comprises one of plasma etching, reactive ion etching, and flood ion beam sputtering techniques.

4. The method as in claim 1 wherein the operation of anisotropically etching the metal barrier layer at the bottom of the opening comprises plasma etching the metal barrier layer with an etch chemistry that includes at least one of argon, hydrogen, $C_zH_yF_x$, and $SF_x$.

5. The method of claim 1 wherein the insulating layer is comprised of a low-K dielectric material.

6. The method of claim 1 wherein the method is used to form electrical interconnect structures on a semiconductor chip.

7. The method of claim 1, wherein the opening is a via.

8. The method as in claim 1 wherein the operation of b) forming the barrier layer includes pre-cleaning the substrate using a plasma formed by igniting at least one argon, hydrogen, and $C_xH_yF_z$, into the plasma and then forming the metal barrier layer over the pre-cleaned substrate.

9. The method as in claim 1 wherein the operation of b) forming the barrier layer comprises forming the metal barrier layer such that the portions of the barrier layer on the insulating layer and on the sidewalls of the opening are thicker than the portion of the barrier layer on the bottom of the opening.

10. The method as in claim 9 wherein forming the metal barrier layer is accomplished using physical vapor depositing a barrier material at an angle.

11. The method as in claim 9 wherein the operation of anisotropically etching the metal barrier layer at the bottom of the opening is accomplished using a technique selected from among reactive ion etching, plasma etching, flood ion beam sputtering techniques.

12. The method as in claim 1 wherein the operation of anisotropically etching the metal barrier layer at the bottom of the opening is accomplished using a technique selected from among reactive ion etching, plasma etching, flood ion beam sputtering techniques.

13. The method as in claim 11 wherein the operation of anisotropically etching the metal barrier layer at the bottom of the opening comprises plasma etching the metal barrier layer with an etch chemistry that includes at least one of argon, hydrogen, $C_zH_yF_x$, and $SF_x$.

14. The method of claim 11 wherein the insulating layer is comprised of a low-K dielectric material.

15. The method of claim 11 wherein the method is used to form electrical interconnect structures on a semiconductor chip.

16. A semiconductor integrated circuit formed using the method described in claim 11.

17. The method of claim 11, wherein the opening is a via.

* * * * *